United States Patent
Chen

(10) Patent No.: US 6,338,032 B1
(45) Date of Patent: Jan. 8, 2002

(54) SYSTEM AND METHOD FOR TRIMMING IC PARAMETERS

(75) Inventor: Marcellus R. Chen, Fremont, CA (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 09/213,003

(22) Filed: Dec. 16, 1998

(51) Int. Cl.[7] .................................................. G06F 9/455
(52) U.S. Cl. ........................... 703/16; 716/5; 327/564; 341/144
(58) Field of Search ............................... 703/13, 14, 15, 703/16; 716/1, 4, 5; 327/525, 530, 564; 341/144, 155

(56) References Cited

U.S. PATENT DOCUMENTS

| | | | |
|---|---|---|---|
| 5,361,001 A | | 11/1994 | Stolfa .......................... 327/530 |
| 5,396,130 A | * | 3/1995 | Galbraith et al. ............ 326/102 |
| 5,760,720 A | * | 6/1998 | Nolan et al. .................. 341/120 |
| 6,107,950 A | * | 8/2000 | Fisher et al. ................. 341/172 |
| 6,118,398 A | * | 9/2000 | Fisher et al. ................. 341/144 |

OTHER PUBLICATIONS

Tang et al., A.T.K. Self–Calibration for High Speed, High–Resolution D/A Converters, 2nd International Conference on Advanced A–D and D–A Conversion Techniqies and Their Applications, Jul. 1994, pp. 142–147.*

Conroy et al., C.S.G. Statistical Design Techiques for D/A Converters, IEEE Journal of Solid–State Circuits, vol. 24, No. 4, Aug. 1989, pp. 1118–1128.*

Gu et al., Z. A Novel Self–Calibrating for Video–Rate 2–Step Flash Analog–to–Digital Converter, 1992 IEEE International Symposium on Circuits and Systems, ISCAS '93, vol. 2, pp. 601–604.*

Das et al., S. Electrical Trimming of Ion–Beam–Sputtered Polysilicon Resistors by High Current Pulses, IEEE Transactions on Electron Devices, vol. 41, No. 8, Aug. 1994, pp. 1429–1434.*

Suh et al., Jung–Won Offset–Trimming Bit–Line Sensing Scheme for Gigabit–Scale DRAM's, IEEE Journal of Solid–State Circuits, vol. 31, No. 7, Jul. 1996, pp. 1025–1028.*

Gupta et al., S. A 3 to 5 V CMOS Bandgap Voltage Reference with Novel Trimming, IEEE 39th Midwest Symposium on Circuits and Systems, vol. 2, Apr. 1996, pp. 969–972.*

Mijanovic et al., Z. R/2R/sup +/Digital–Analog Converter (DAC), Instrumentation and Measurement Technology Conference, Proceedings, Quality Measurements: The Indespensable Bridge between Theory and Reality, IEEE, vol. 2, Jun. 1996, pp. 1034–1039, Jul. 1994.*

* cited by examiner

Primary Examiner—Kevin J. Teska
Assistant Examiner—Russell W. Frejd
(74) Attorney, Agent, or Firm—Koppel & Jacobs

(57) ABSTRACT

A circuit and method for trimming and simulating the effect of trimming a plurality of IC parameters. Trim signals which affect respective IC parameters are generated with respective digital-to-analog converters (DACs) in response to digital bit patterns. A parameter to be trimmed is selected, a bit pattern is applied to a DAC and a trim signal generated, and the value of the parameter that results is measured. Bit patterns are iteratively created until one is identified that brings the parameter within an acceptable range. The identified bit pattern is then permanently encoded using programmable subcircuits containing poly fuses. The bit patterns are received serially to conserve I/O pins. A number of DACs are provided to enable a number of different parameters to be simulated and trimmed. A switching network is provided that selectably switches otherwise inaccessible internal nodes to an I/O pin for measurement. The trimming circuitry. is packaged within the IC package and is operable via its I/O pins, enabling the IC's parameters to be trimmed post-assembly.

29 Claims, 8 Drawing Sheets

| DATA PACKET | SOP | PARAM_SEL | SIM/TRIM | TRIM CODE | EOP |
|---|---|---|---|---|---|
| CLR | 00000000 | 00 | 00 | 00000000000 | 00000000 |
| SIM | 01111110 | XX | 01 | XXXXXXXXXXX | 10000001 |
| TRIM | 01111110 | XX | 10 | XXXXXXXXXXX | 10000001 |
| PERM_DISABLE | 01111110 | 00 | 11 | ZZZZZZZZZZZ | 10000001 |
| PARAM_MEAS | 01111110 | XX | ZZ | ZZZZZZZZZZZ | 10000001 |

X = 1 or 0 as appropriate

Z = don't care

FIG.2

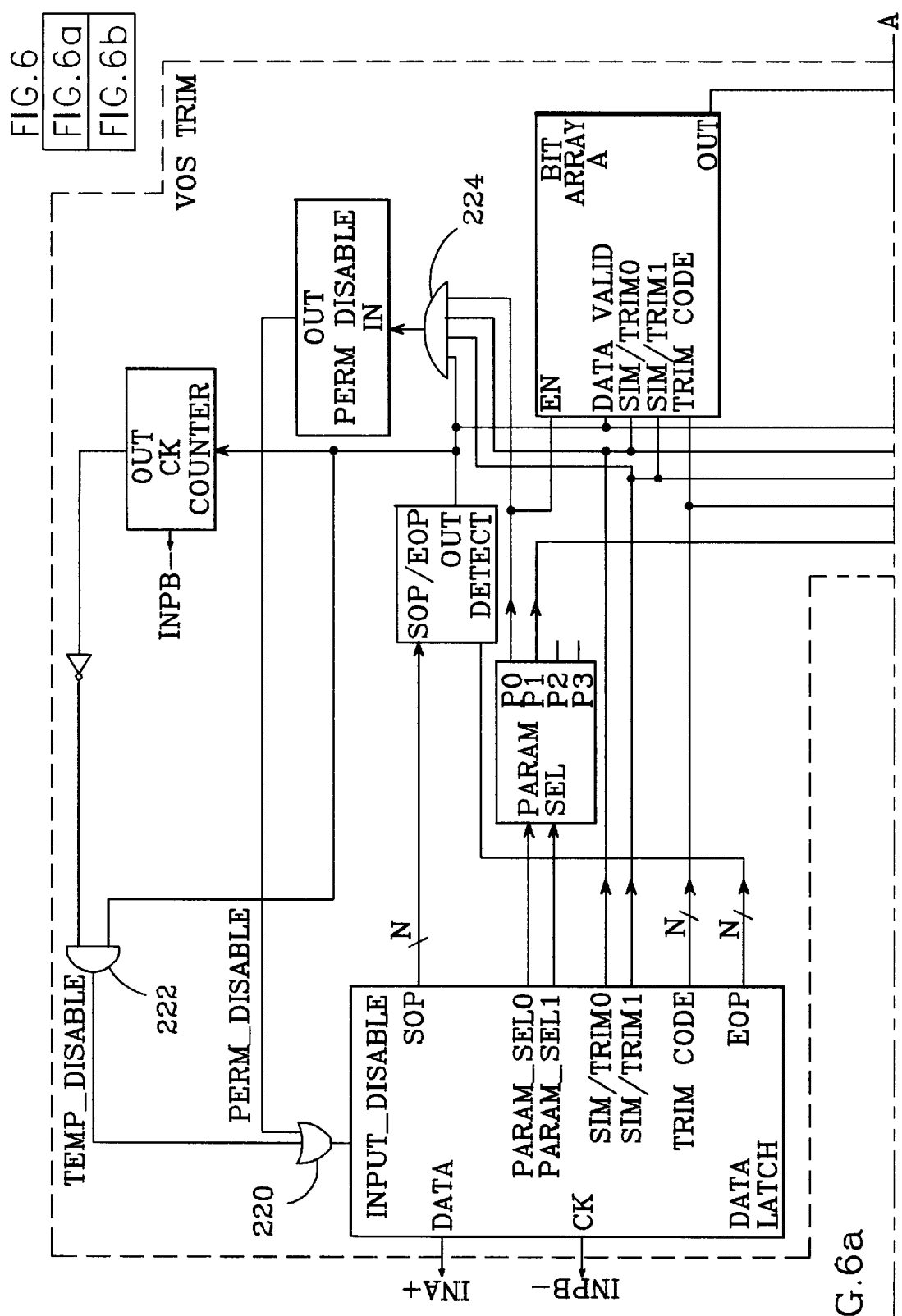

SYSTEM AND METHOD FOR TRIMMING IC PARAMETERS

BACKGROUND OF THE INVENTION

1. Field of the Invention

This invention relates to the field of integrated circuit (IC) parameter trimming techniques.

2. Description of the Related Art

Many integrated circuits, particularly analog ICs such as voltage references and operational amplifiers, have parameters which must be "trimmed" to deliver the performance promised in the IC's specifications. IC op amps, for example, often include trim inputs for adjusting an amplifier's offset voltage, which is varied in accordance with an applied trim signal.

A number of techniques are employed to achieve the specified performance. For example, a number of wafers can be tested, with those that meet the specifications kept and the others rejected. Since this approach requires each wafer to be tested, yet results in a number of wafers being discarded, it is very costly. Another common technique involves the use of thin film resistors that are laser trimmed during assembly. This method requires the use of costly equipment, the use of which is very time consuming. Furthermore, because the trimming is done during assembly, the trimmed parameter may drift due to subsequent assembly steps.

Another disadvantage to conventional trimming techniques arises when a parameter needing trimming is not accessible via one of the IC's I/O pins, i.e., the value of the parameter cannot be determined by connection to any I/O pin. To enable these otherwise inaccessible parameters to be measured, probe pads are located on the wafer. However, the probe pads, with a typical size of 100 $\mu$m×100 $\mu$m each, occupy considerable space and thereby increase die cost.

A trimming approach specifically directed to providing a trimmed resistance value is described in U.S. Pat. No. 5,361,001 to Stolfa. Rather than laser trim a thin film resistor, Stolfa uses a resistive ladder network. Some of the ladder's individual resistors have respective transistors connected across them, which, when switched on, disable conduction through the resistor and effectively remove it from the ladder network. Stolfa's method allows a proposed trim value to be "previewed", and if found acceptable, fuses can be blown to permanently fix the configuration of the ladder network.

Stolfa's method suffers from several serious drawbacks, however. Each of his transistors is operated with a respective control circuit, each of which receives an input via a respective pin on the IC package. The number of IC pins required for this parallel input of data may be unacceptably large. Also, his data input and fuse blowing circuitry is very simple, with nothing provided to prevent the accidental (permanent) trimming of the ladder to an erroneous value. Stolfa's method in apparently intended for adjusting a single parameter, and no means of measuring parameters not accessible via an I/O pin is provided. Furthermore, Stolfa removes resistors from the ladder network by switching on a transistor that is connected across the resistor. Because the resistance through a transistor can vary over time and temperature, the trimmed value is susceptible to drift.

SUMMARY OF THE INVENTION

A system and method for trimming and simulating the effect of trimming IC parameters are presented which overcome the problems noted above. Trim values for a number of different parameters can be iteratively simulated until acceptable, and then accurately and permanently fixed.

The invention provides trim signals, i.e., currents and/or voltages, each of which affects a respective IC parameter such as the offset voltage of an operational amplifier. The trim signals are preferably generated with respective digital-to-analog converters (DACs) in response to digital bit patterns received at their respective inputs. During trim simulation, a data latch circuit receives a bit pattern via an input/output (I/O) pin, latches it, and applies it to a DAC associated within a particular parameter of interest. Bit patterns are iteratively applied until one is identified that brings the associated parameter within an acceptable range. The trim is then made permanent by activating an interface circuit to permanently encode the identified bit pattern so that it is always applied to the DAC's input.

The system preferably receives bit patterns in a serial bit stream via a single I/O pin, to reduce the number of pins needed by the system. To insure the validity of the incoming bit patterns and prevent accidental erroneous trimming, the system is arranged to require the receipt of specific data sequences before a trim signal will be simulated or the fuses blown. A number of DACs are provided to enable a number of different parameters to be simulated and trimmed. To allow internal IC nodes that are not connected to an I/O pin to be monitored during trim simulation, a switching network is provided that selectably switches the internal nodes to a specified I/O pin for measurement.

The circuitry being trimmed, along with the system's data latch, DAC, and interface circuits are all packaged within the same IC package. The simulation and trimming of the IC's parameters is preferably done post-assembly, eliminating the risk of post-assembly drift associated with prior art trimming techniques. The need for probe pads on a wafer is also eliminated.

Further features and advantages of the invention will be apparent to those skilled in the art from the following detailed description, taken together with the accompanying drawings.

BRIEF DESCRIPTION OF THE DRAWINGS

FIG. 2 is a table showing a set of data packets suitable for controlling a system per the present invention.

DETAILED DESCRIPTION OF THE INVENTION

Figure 1:
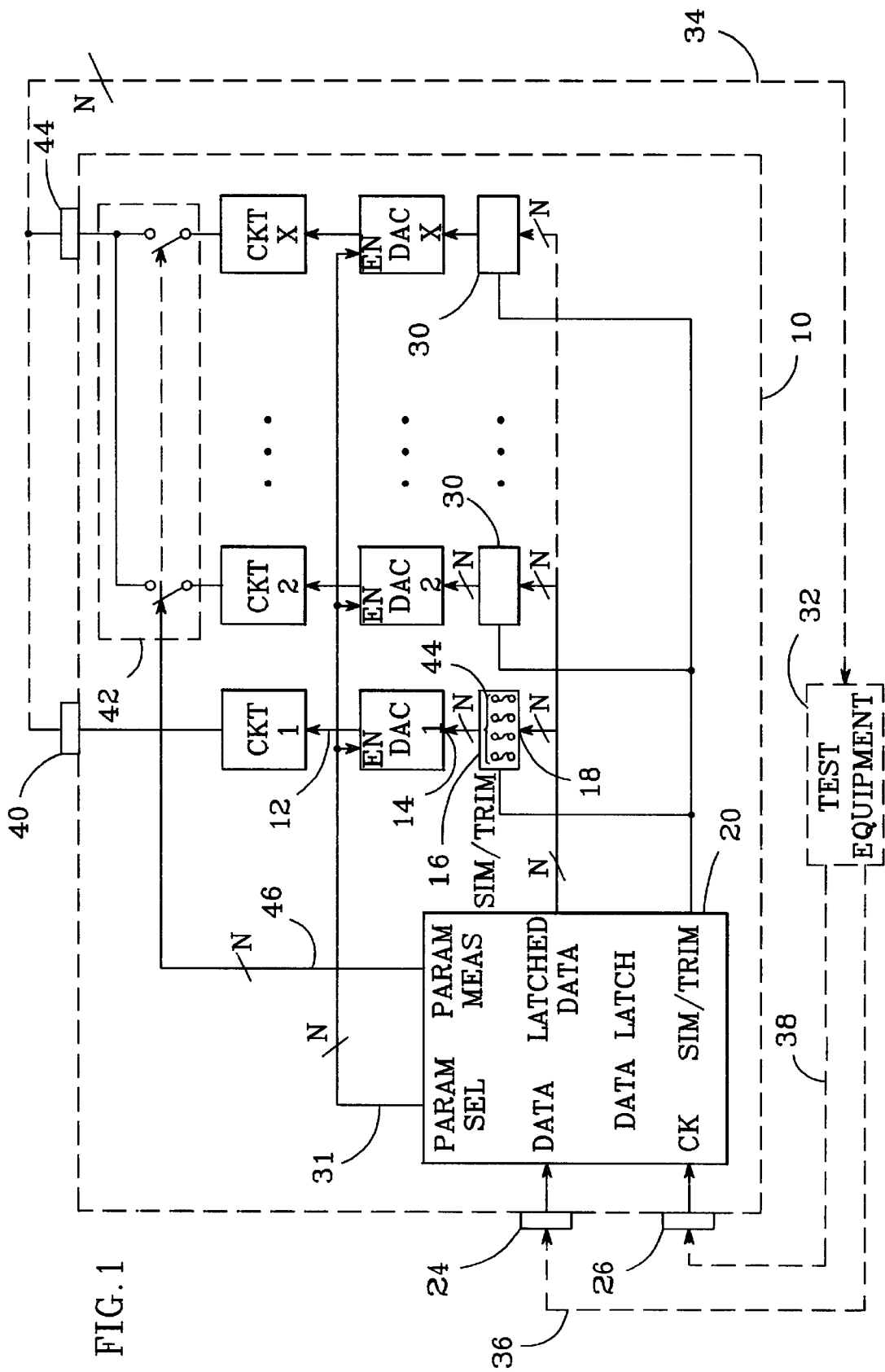
FIG. 1 is a block diagram of a system that trims and simulates the trimming of IC parameters.

A block diagram of a system which enables the trimming of an IC parameter to be simulated before being permanently trimmed is shown in FIG. 1. An IC 10 contains at least one electronic circuit CKT 1. The circuit has at least one associated parameter—referred to herein as a "parameter of interest"—that, to insure the performance of the IC to its published specifications, is trimmable. Examples of parameters that are commonly trimmed during assembly includes the offset voltage of an operational amplifier or the frequency produced by a current-controlled oscillator. The parameter of interest is adjusted via a "trim signal" 12, typically a current or a voltage. The trim signal is supplied to CKT 1, which is arranged to vary the parameter of interest in response to a varying trim signal.

A digital-to-analog converter (DAC) circuit DAC 1 is used to generate the trim signal 12 supplied to CKT 1. As used herein, a DAC is a circuit that receives a digital bit pattern at an input 14, and generates an output (voltage or current) that varies with the value of the received bit pattern. For example, operational amplifiers often have a trim input for adjusting the amplifier's offset voltage, which is varied in accordance with a current received at the trim input. If CKT 1 is such an op amp, DAC 1 is arranged to generate an output current that varies with the bit pattern received at its input 14. Input 14 is a multi-bit input; the "N" adjacent to the line connected to input 14 indicates this multi-bit characteristic. Note that a number of lines in FIG. 1 have an adjacent "N", each of which indicates that their respective lines can be multi-bit. It is not implied that each "N"-labeled line has the same number of bits.

To simulate a trim adjustment, a bit pattern is applied to the input 14 of DAC 1. The value of the parameter of interest is monitored to determine whether it is within an acceptable range. If not, a different bit pattern is applied and the parameter is again monitored. This sequence of steps is repeated until a bit pattern is identified that causes the parameter to be within the acceptable range; this is referred to as a "identified" bit pattern.

The bit pattern supplied to input 14 is delivered by an interface circuit 16, which receives the bit pattern at its own multi-bit input 18. Interface circuit 16 also receives an input labeled SIM/TRIM, the value of which indicates whether a trim adjustment is to be simulated (SIM/TRIM=SIM) or permanently encoded (SIM/TRIM=TRIM). Interface circuit 16 is arranged to provide bit patterns to DAC 1 in one of two ways, depending on the state of SIM/TRIM. If a trim adjustment is to be simulated, SIM/TRIM input is set to SIM, and circuit 16 passes the bit pattern applied at input 18 onto DAC 1. When a bit pattern is identified which brings the selected parameter into spec, SIM/TRIM is set to TRIM, which causes interface circuit 16 to "permanently encode" the identified bit pattern (as described below). Henceforth, the identified bit pattern is always applied to DAC 1 as long as the IC is powered and operational.

Bit patterns are preferably applied to interface circuit 16 by an input circuit 20, preferably a data latch circuit. Bit patterns are typically generated by test equipment external to IC 10, and are received at an input DATA to the data latch circuit 20 via one or more of the IC's I/O pins. Bit patterns are preferably received in a serial bit stream, so that only one I/O pin—pin 24—is needed. To clock in the serial bit stream of a bit pattern, the data latch circuit 20 also has a clock input CK, connected to an I/O pin 26. A serial bit stream is preferred to keep the number of I/O pins used by the trimming system to a minimum. The data latch circuit 20 could also be configured to receive a bit pattern as a parallel input, but this approach would require an I/O pin for each bit of the pattern; more I/O pins require more die area and result in a higher die cost.

The data latch circuit 20 preferably includes additional circuitry used to provide other control functions for the trimming system. For example, the circuit 20 preferably controls the state of the SIM/TRIM line connected to interface circuit 16, based on the value of the bit pattern presented at its DATA input. This is accomplished with decoding circuitry within circuit 20, so that receipt of a specified bit pattern causes the SIM/TRIM line to be set to one state or the other.

The system can be configured to trim a number of different electronic circuits within IC 10. As shown in FIG. 1, a number of other electronic circuits CKT 2, ..., CKT X receive respective trim signals generated by respective DACs DAC 2, ..., DAC X. Each DAC is driven by a respective interface circuit 30, with their respective SIM/TRIM inputs each connected to the SIM/TRIM line controlled by data latch circuit 20.

The particular parameter to be trimmed (or for which a trim adjustment is to be simulated) is selected via the bit pattern presented to data latch circuit 20. As with the state of the SIM/TRIM line, the latch circuit includes decoding circuitry that activates a given parameter's DAC and/or interface circuit based on the content of the instruction received. In FIG. 1, each DAC has an enable input EN which is connected to a set of control lines 31 that are connected to parameter select (PARAM SEL) outputs of data latch circuit 20.

Simulating a trim adjustment prior to making it permanent requires a means for monitoring the selected parameter. Test equipment 32 external to IC 10 is typically used for this purpose. The test equipment receives signal lines 34 as inputs, each of which is connected to an I/O pin of the IC by which the value of one or more parameters of interest can be measured. The equipment 32 produces outputs 36 and 38 which deliver the bit patterns and clock signals, respectively, to data latch circuit 20. Test equipment 32 preferably operates under software control, with the parameter selection, parameter measurement, trim simulation and permanent trim steps all automated.

In some cases, a signal from which the value of a selected parameter can be determined is available at one of the IC's I/O pins. Assume, for example, that CKT 1 is an operational amplifier, the selected parameter is the op amp's offset voltage, and DAC 1 generates a trim signal connected to adjust the offset voltage. Assuming the amplifier's output is connected to an I/O pin 40 (as shown in FIG. 1), its offset voltage can be monitored at I/O pin 40 as the trim signal is varied. Note that to properly set an amplifier's offset voltage, its inputs should also be accessible via I/O pins: a typical offset voltage adjustment requires monitoring the voltage difference between the amplifier's inputs along with its output while the trim signal is varied.

The values of other parameters of interest may not be accessible at the IC's I/O pins. Switching circuitry 42 is preferably provided within the IC that allows each of the inaccessible parameters to be individually connected to an I/O pin. As shown in FIG. 1, neither of the parameters of interest in CKT 2 and CKT X are directly connected to an I/O pin. However, both parameters are connected to an I/O pin 44 via respective switches within switching circuitry 42. Data latch circuit 20 preferably selects the parameter to be connected to I/O pin 44 by controlling the state of the switching circuitry's switches via a set of control lines 46 connected to an output PARAM MEAS; the latch circuit includes decoding circuitry which closes the appropriate switch upon receipt of a particular bit pattern. A single I/O pin is preferably used to access the otherwise inaccessible parameters, to keep the number of I/O pins needed by the simulation and trimming system as low as possible, due to the costs associated with an increasing number of pins. If these costs are deemed tolerable, or if I/O pins are available, otherwise inaccessible parameters may also be directly connected to respective I/O pins, and switching circuitry 42 may be unnecessary. Furthermore, the present invention may be used to simulate and trim just one IC parameter; in this case, no switching circuitry would be required.

Using the system as described above, parameters within an IC that require trimming can be 1)simulated by enabling the appropriate interface circuit and DAC, 2)monitored—either directly via an I/O pin or by being switched to an I/O pin, and, when a bit pattern has been identified that brings the parameter within an acceptable range, 3)permanently trimmed. This process can be repeated for each of the IC's trimmable parameters. The determination of whether a parameter is within an "acceptable range" is preferably made automatically, with appropriately programmed automatic test equipment 32, or manually by an operator. Similarly, the bit patterns supplied to the DACs can be generated per a human operator's direction, or the test equipment 32 can be arranged to automatically vary the bit patterns until the parameter being trimmed is within the acceptable range.

Interface circuits 16, 30 are made to permanently apply fixed bit patterns to their respective DACs when their SIM/TRIM line is set to TRIM. This is preferably accomplished with the use of subcircuits which include fuses 44 made from polycrystalline silicon, i.e., "poly"fuses; such fuses are typically blown by forcing a known current through them or by being vaporized by a laser. One poly fuse-containing subcircuit is provided for each output bit of the interface circuit. The fuses make the subcircuits programmable, enabling their corresponding output bits to be permanently set to either a logic "zero" or a logic "one" state as needed. The use of poly fuses to provide a permanent logic state is well-known in the art of analog circuit design, and is discussed, for example, in U.S. Pat. No. 5,361,001 to Stolfa at col. 4, lines 9–30.

Note that the system configuration shown in FIG. 1 is merely illustrative, and that many other system configurations could provide the functionality required by the present invention. For example, it is not essential that each DAC have an enable input to allow a given parameter to be simulated; this function could be provided by a set of controllable switches installed between each DAC and its respective electronic circuit, for example. Nor is it essential that all of the functions ascribed to data latch circuit 20 be contained in a single circuit, or that latch circuit 20 use a specific instruction decoding scheme to operate the system. For example, discrete control lines independent of the latch circuit could be manipulated to control the switching circuitry 42, the SIM/TRIM line, and/or the parameter select function. This would greatly reduce the complexity of the data latch circuit. If a sufficient number of I/O pins are available, the data latch circuit 20 may be dispensed with altogether, with bit patterns that are "x" bits wide applied to the DACs in parallel via x I/O pins. The large number of I/O pins required by this approach are likely to render it impractical, however. If this type of parallel input scheme is used, circuit 20 need not include a data latching function at all-this function could be moved off-chip.

As mentioned above, an instruction convention is preferably used to control the present system and to prevent accidental erroneous trimming. The instructions that control the system are preferably formatted into data packets which have two components: 1)a bit pattern that provides the information necessary to control the system, and 2)a number of clock pulses equal to the number of bits in the bit pattern. A data packet's bit pattern and clock pulses are sent on two separate lines to the data latch circuit. Thus, an instruction's bit pattern is input to the data latch circuit as a serial bit stream, with each bit being clocked in by its associated clock pulses.

A table illustrating an exemplary group of data packets and their formatting is shown in FIG. 2. As used herein, the terms "data packet" and "instruction" are used interchangeably; use of either term implies both a bit pattern as shown in FIG. 2, along with the bit pattern's associated clock pulses. The data latch circuitry is preferably arranged so that an instruction will not be executed unless formatted exactly as specified in the table. Each instruction includes the following fields: SOP (start of packet) and EOP (end of packet)—these fields appear at the start and end of an instruction. The data between SOP and EOP is considered valid only when these fields are correctly received by the latch circuit; if they are not correctly received, no operation will take place. SOP and EOP should be designed so that there is no possibility of false SOP or EOP detection. $PARAM_{13}$ SEL—these bits (or bit) are used to select which IC parameter is to be simulated and/or trimmed. The PARAM_SEL—outputs of the data latch circuit are set in accordance with this field. The number of bits in this field is determined by the number of parameters to be trimmed—using two bits as shown allows up to four parameters to be selected. SIM/TRIM—these bits (or bit) are used to set the SIM/TRIM output line from the data latch circuit. As shown, a simulation is performed when this field contains "01", and a trim operation performed the field is equal to "10". A "00" indicates that nothing is to be done. A "11" can be used to indicate that all trimming operations have been completed, and that the inputs to the trim circuitry are to be permanently disabled (discussed in detail below). To insure that permanent disablement is done erroneously, it is also required that "00" be detected in the $PARAM_{13}$ SEL field. TRIM CODE—this is the bit pattern that is applied to a particular DAC to adjust the parameter selected with the PARAM_SEL field. The length of the trim code depends on the trim signal resolution needed by the circuitry being trimmed, and whether or not sign bits are to be used. The trim code field in FIG. 2 is 12 bits long, divided into 10 bits of resolution and 2 sign bits.

Note that an "x" in a field's bit position means that the corresponding bit has a value of either "1" or "0", which defines some aspect of the system's operation; a "z" in a bit position means that the value of the bit has no significance.

Five data packets are defined in FIG. 2; the function of each is discussed below: CLR—when the data latch circuit has detected valid SOP and EOP fields in a given instruction, the DATA and CK inputs to the data latch circuit 20 are preferably temporarily disabled—to prevent trim data corruption—and a counter is preferably started. The counter is also connected to the CK line, but unlike the data latch circuit, it does not get disabled. In a preferred embodiment, the DATA and CK inputs are connected to I/O pins that are also used for the IC's electronic circuits; DATA and CK could share the I/O pins connected to an op amp's inputs, for example. As a result, once the DATA and CK inputs to the data latch circuit are disabled, there is likely to be transient activity on the DATA and CK pins as the circuit being trimmed is exercised. These transients may cause the counter to be clocked.

The system is arranged to re-enable the DATA and CK inputs when the counter overflows, which can occur in one of two ways: 1) the transients on the CK line could cause the counter to overflow, or 2) a CLR data packet can be sent. The CLR data packet includes enough clock pulses to guarantee that the counter will overflow and re-enable the DATA and CK inputs. The counter is preferably arranged to require more clock pulses to overflow than are likely to be encountered during a simulation. SIM—this instruction is used to simulate a trim adjustment. The parameter for which a simulated trim is being performed is specified in the instruction's PARAM_SEL field, the SIM/TRIM field is set to SIM, and a bit pattern fills the TRIM CODE field. If the value in TRIM CODE does not bring the parameter into an acceptable range, another SIM instruction is sent—with a different bit pattern in the TRIM CODE field. This process is repeated until a bit pattern is identified (i.e., the "identified bit pattern") that causes the parameter to be brought within an acceptable range. TRIM—when a bit pattern has been identified that causes a parameter to be within an acceptable range, a TRIM instruction is sent to permanently encode the identified bit pattern, typically by blowing poly fuses as needed to permanently present the identified bit pattern to the corresponding DAC. The PARAM_SEL field identifies the parameter to be trimmed, the SIM/TRIM field is set to TRIM, and the identified bit pattern is in the TRIM CODE field. PERM_DISABLE—the system preferably includes a "disable" fuse that, when blown, permanently disables the data latch's DATA and CK inputs and thereby prevents unwanted transient currents from flowing through the trim circuitry. The PERM_DISABLE instruction is sent to blow this disable fuse after all trimmable IC parameters have been trimmed. To prevent the disable fuse from being inadvertently blown, it is preferred that the SOP, PARAM_SEL, SIM/TRIM, and EOP fields be required to contain specific bit patterns. PARAM_MEAS—as noted above, some ICs may have a number of parameters that are not directly connected to an I/O pin, but which require trimming. In such a case, circuitry such as switching circuitry 42 can be used to connect a parameter of interest to an I/O pin. The PARAM_MEAS instruction is used to control the switching, with the parameter to be switched to the I/O pin indicated in the instruction's PARAM_SEL field.

Figure 3:
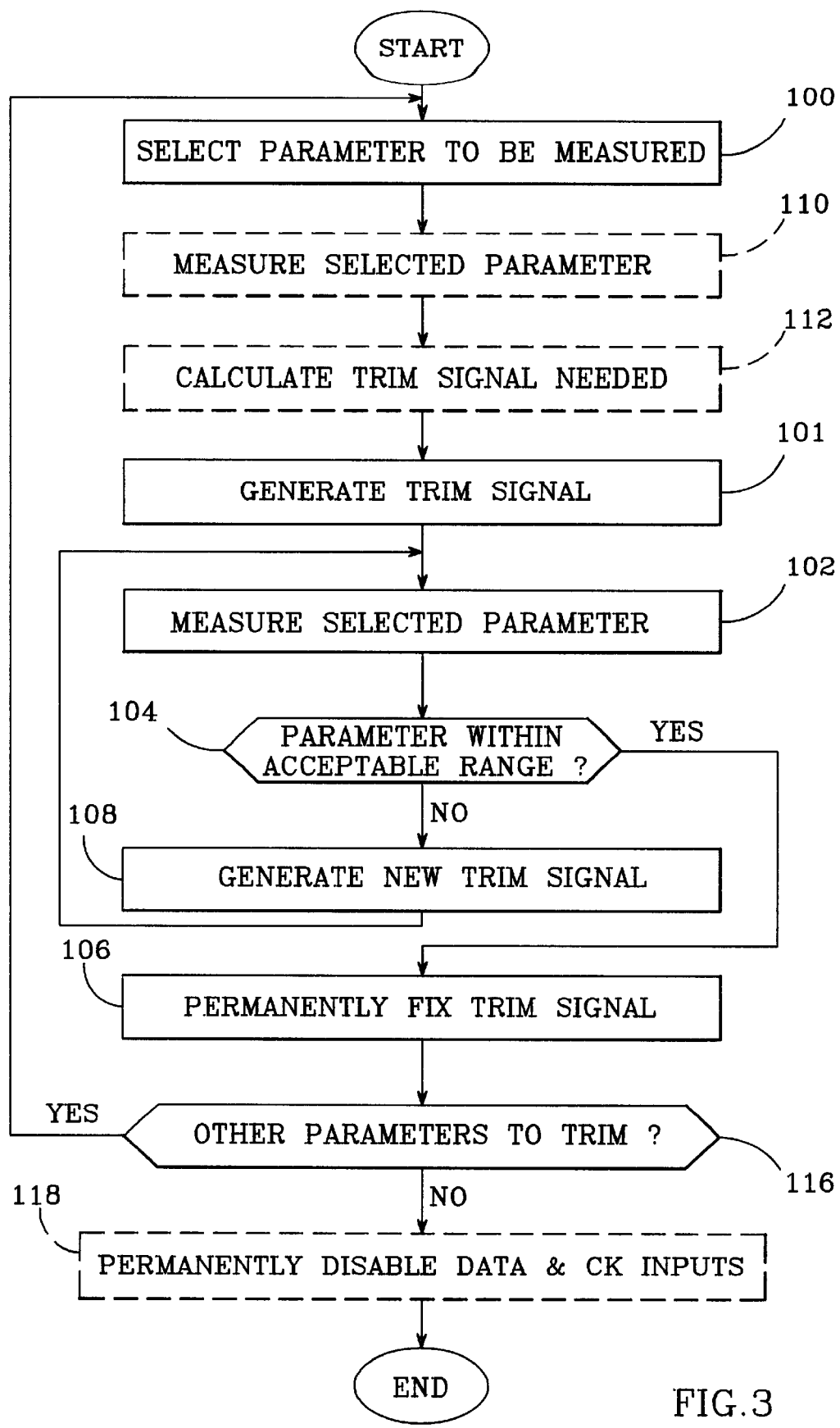
FIG. 3 is a flow chart illustrating a method of trimming and simulating the trimming of IC parameters per the present invention.

A method of trimming and simulating the trimming of IC parameters per the present invention is shown in the flow chart of FIG. 3. Some of the steps shown are optional—these are indicated by being enclosed in a dashed box. The essential steps of the method begin with a step 100, in which a parameter to be measured is selected. The PARAM_SEL field of the SIM and TRIM data packets enables the parameter of interest to be selected (not required in an IC having just one trimmable parameter), and switching circuitry 42—as controlled by the PARAM_MEAS instruction shown in FIG. 2—provides the ability to selectably switch otherwise inaccessible parameters to an I/O pin.

A trim signal for the selected parameter is generated in step 101, to simulate the effect of a permanent trim adjustment. The value of the selected parameter is measured at step 102, and a test is performed at step 104 to determine whether the parameter is within an acceptable range. If it is, the trim signal that caused the selected parameter to be within an acceptable range is permanently fixed (step 106). If the parameter is not within the acceptable range, a trim signal having a different value that the previous trim signal is generated (step 108), and the selected parameter is again measured (step 102). This cycle of measure, test, and generate (steps 102, 104 and 106) is repeated until the test at step 104 is passed.

After a trim signal has been permanently fixed, a test is performed in step 116 to determine if there are other parameters to be trimmed. If not, the process either ends or continues with optional final step 118. In step 118, the DATA and CK inputs to the data latch circuit are permanently disabled, preventing any transient currents from flowing in the trim circuitry. This capability is supported by the PERM_DISABLE data packet shown in FIG. 2, in which the receipt of a specific bit pattern causes the DATA and CK inputs to be permanently disabled.

An initial measurement of the selected parameter (step 110) can be optionally made prior to generating a trim signal at step 101. Based on this measurement, a calculation of the trim signal that is likely to bring the selected parameter within an acceptable range is made (step 112), and a trim signal of this magnitude is then generated at step 101. By performing these additional steps (steps 110 and 112), the trim signal needed to bring the selected parameter into spec may be arrived at quicker.

Figure 4:
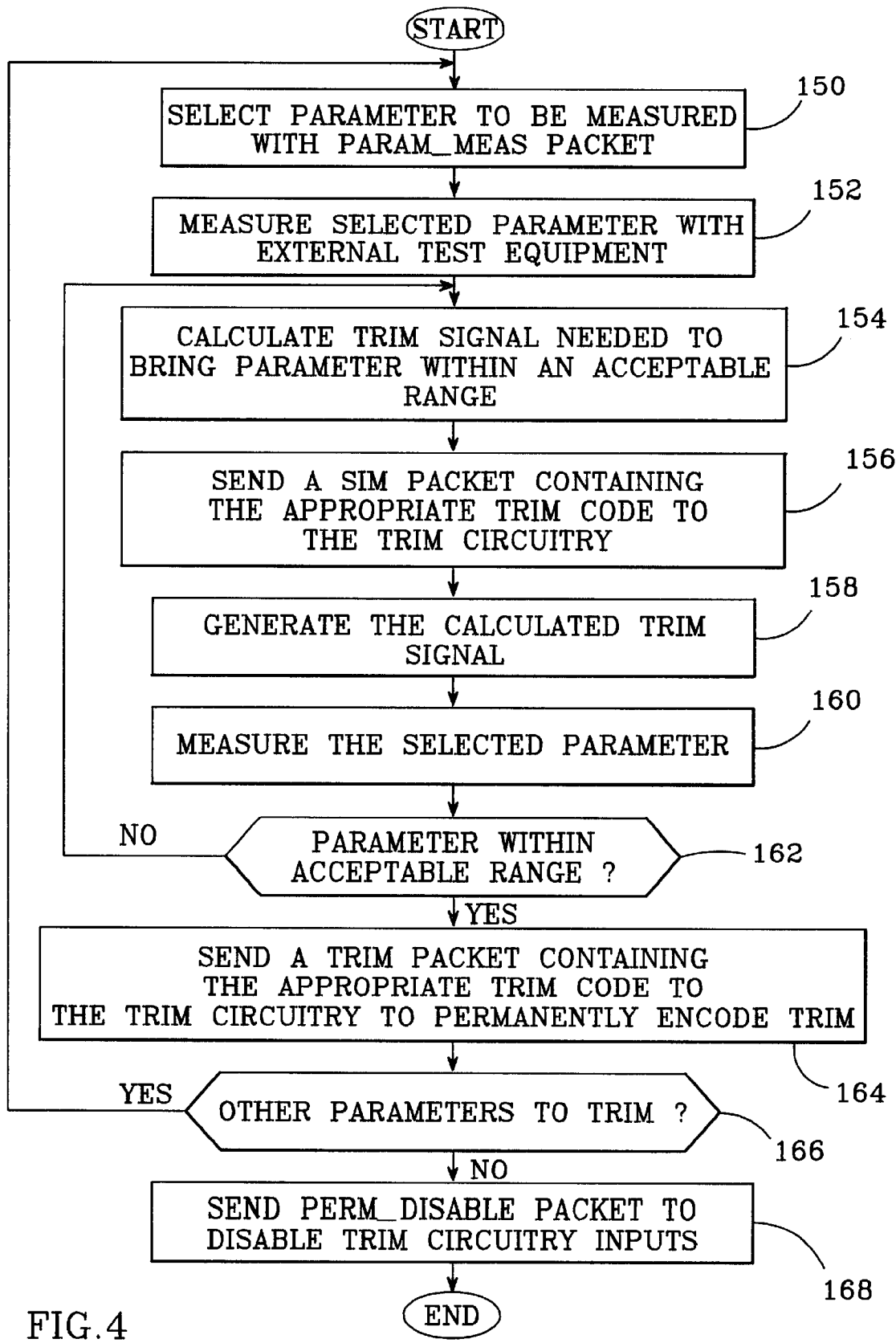
FIG. 4 is a flow chart illustrating a preferred method of trimming and simulating the trimming of IC parameters per the present invention.

The inventive method requires that the essential steps of the process shown in FIG. 2 be performed, but it is not essential to use either the instruction convention of FIG. 2 or the system of FIG. 1 to do so. However, FIGS. 1 and 2 do define the preferred system. A preferred method which is preferably practiced on the preferred system in shown in FIG. 4. A parameter to be measured is selected in step 150, using the PARAM_SEL instruction field, the PARAM_MEAS data packet and switching circuitry 42. An initial measurement is made of the selected parameter (step 152) using external test equipment 32. The preferably automated test equipment calculates the trim signal needed to bring the selected parameter into an acceptable range (step 154). A SIM data packet is then assembled (step 156), with the packet's TRIM CODE field filled with the bit pattern that will cause the calculated trim signal to be generated; the SIM packet is input to data latch circuit 20, preferably in a serial bit stream, the packet's validity is verified, and the TRIM CODE is applied to the DAC (DAC 1, . . . , DAC X) associated with the selected parameter. The DAC generates the calculated trim signal in step 158, and test equipment 32 again measures the selected parameter (step 160).

A test is performed (step 162) to determine whether the selected parameter is now within the acceptable range. If not, control returns to step 154: a new trim signal value is calculated and generated (steps 156 and 158), and the selected parameter measured (step 160). These steps (154, 156, 158, 160, 162) are repeated until the selected parameter is brought within the acceptable range; the TRIM CODE bit pattern that brings the selected parameter into spec is the "identified" bit pattern.

When a simulated trim has brought a selected parameter within the acceptable range, control passes to step 164, in which the simulated trim adjustment is made permanent. A TRIM data packet is sent to data latch circuit 20, which causes the appropriate interface circuit (16, 30) to permanently encode the identified bit pattern. The permanent encoding is preferably accomplished by blowing poly fuses 44 as appropriate to cause the identified bit pattern to be presented to the input of the interface circuit's associated DAC, as long as the IC is powered.

A test is performed at step 166 to determine if there are any other parameters to be trimmed. If so, control returns to step 150, and another parameter is selected. The steps 150–166 are repeated until all trimmable IC parameters have been trimmed. Step 168 is then performed, in which a PERM_DISABLE data packet is sent to data latch circuit 20 to permanently disable its DATA and CK inputs, completing the simulation and trimming process.

If the system is implemented as discussed in the discussion of the CLR data packet, above, the CLR data packet may be sent to re-enable the inputs to the data latch circuit 20, following the sending of each SIM packet (step 156) and each TRIM packet (step 164).

The system shown in FIG. 1 is typically placed within an IC package, along with the circuitry it is designed to trim. The system enables each parameter of interest, including those that would otherwise be inaccessible, to be selectably simulated, measured and trimmed via the IC's I/O pins. This eliminates the need for any probe pads on the wafer, and enables the simulation and trimming to be performed post-assembly. Post-assembly trimming is preferred, as parameters trimmed during assembly can drift as the IC is assembled. The post-assembly trimming capability provided by the invention thus provides a significant improvement in the accuracy of its trimmed parameters, when compared with prior art methods performed during assembly.

Figure 5:
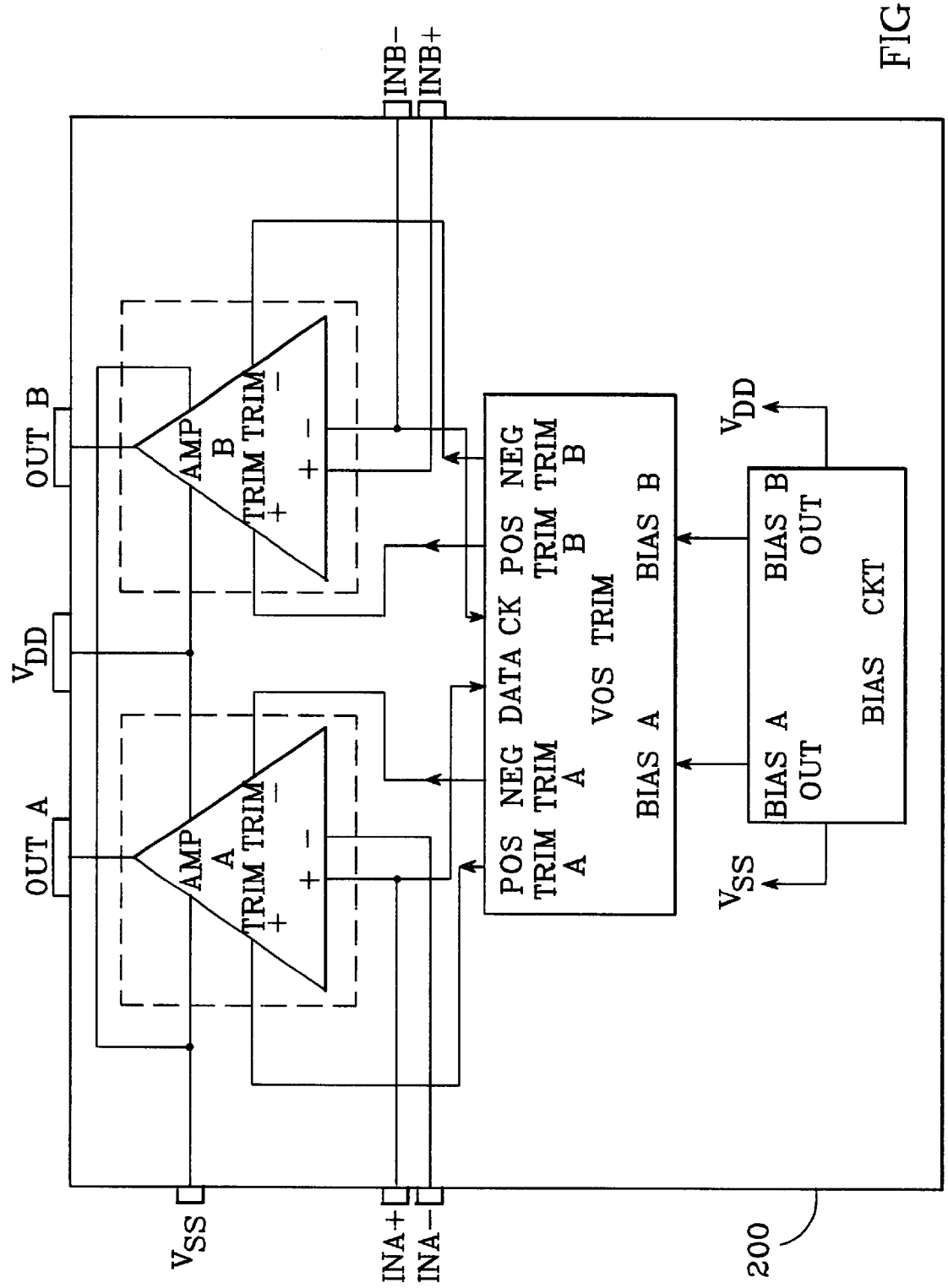
FIG. 5 is a block diagram of an IC which includes a system that trims and simulates the trimming of IC parameters per the present invention.

An exemplary IC 200 containing the present invention is shown in FIG. 5. The IC includes two operational amplifiers AMP A and AMP B. AMP A has two inputs INA+ and INA− and an output OUTA, and AMP B has inputs INB+ and INB− and output OUTB; each of these inputs and outputs is connected to a respective I/O pin of IC 10. The amps receive power via connections to I/O pins carrying power supply voltages $V_{SS}$ and $V_{DD}$. Each amplifier has two trim inputs TRIM+ and TRIM−; the amp is designed so that a current applied at either trim pin affects the amp's offset voltage $V_{OS}$.

IC 200 also contains trim circuit VOS TRIM, which provides trim currents to the TRIM+ and TRIM− inputs of the two amplifiers. The VOS TRIM circuit includes a data latch circuit as discussed above, which receives inputs DATA and CK. To conserve the number of pins required by the trim circuitry, the DATA and CK inputs are preferably connected to I/O pins that serve other purposes. In FIG. 5, the DATA input is connected to the same I/O pin as AMP A's INA+ input, and the CK input is connected to AMP B's INB− input. The DATA and CK inputs are preferably disabled when all trimming is completed, so that the performance of the other circuitry connected to the shared I/O pins is not affected.

The VOS TRIM circuit also contains interface and DAC circuits as discussed above (and described in more detail below), and is arranged to generate trim signals POS TRIM A, NEG TRIM A, POS TRIM B, and NEG TRIM B, which are connected to the TRIM+ and TRIM− inputs of AMP A and the TRIM+ and TRIM− inputs of AMP B, respectively. The VOS TRIM circuit preferably receives bias currents BIAS A and BIAS B, which are used by its DACS. The bias currents are provided by a BIAS CKT, which receives supply voltages $V_{SS}$ and $V_{DD}$ and produces bias current outputs BIAS A OUT and BIAS B OUT.

In operation, external test equipment is connected to IC pins OUT A and OUT B. The parameter to be trimmed (AMP A's offset voltage, for example) is selected by sending an appropriate PARAM_SEL data packet to the VOS TRIM circuit via the INA+ and INB− pins. A SIM data packet is sent to VOS TRIM, which generates trim currents TRIM+ and TRIM− in accordance with the packet's TRIM CODE field. AMP A's offset voltage is adjusted by monitoring its OUT A output while varying the trim currents using SIM packets. When AMP A's $V_{OS}$ is determined to be within an acceptable range, a TRIM packet is sent to fix the trim currents at the values which brought parameter $V_{og}$ within spec.

Figure 6B:
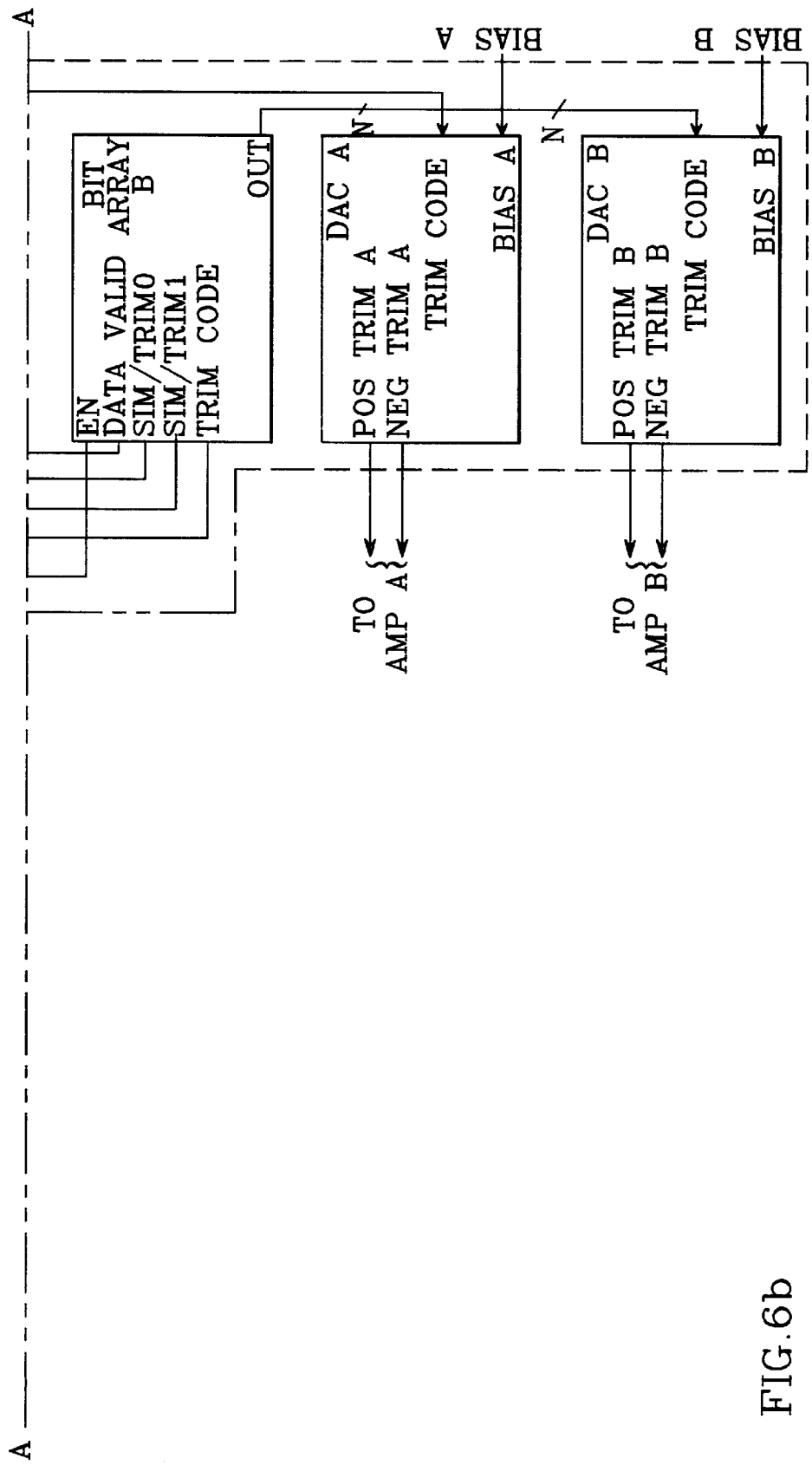
FIG. 6 (comprised of FIGS. 6A and 6B) is a block diagram of the VOS TRIM block shown in the diagram of FIG. 5.

A detailed block diagram of the FIG. 5's VOS TRIM circuit is shown in FIG. 6. A data latch circuit DATA LATCH receives data packets serially via its DATA and CK inputs. DATA LATCH latches in the received bit pattern, divides it into its respective fields, and outputs the divided bit pattern to other circuits for further processing. The bits found in the SOP and EOP fields of the latched bit pattern are sent on to an SOP/EOP DETECT circuit, which produces an output OUT that goes high when the proper SOP and EOP bit patterns are detected. The bits of the PARAM_SEL field (PARAM_SEL0 and PARAM_SEL1) are sent to a decoder PARAM_SEL, which toggles one of four outputs P0–P3 high in accordance with the binary value of its two input bits. DATA LATCH also outputs the bits of the SIM/TRIM field (outputs SIM/TRIM0 and SIM/TRIM1) and the TRIM CODE field.

The DATA LATCH circuit also includes an INPUT_ DISABLE input which, when high, disables the latch circuit's DATA and CK inputs. A circuit 220 performing an OR function generates INPUT_DISABLE, making it high if either of its inputs TEMP_DISABLE or PERM_DISABLE is high. TEMP_DISABLE is generated by a circuit 222 performing an AND function; it goes high when 1) a valid packet has been detected—as indicated by the SOP/EOP DETECT circuit's output going high, and 2)the output of a counter COUNTER—which only goes high when the counter overflows—is low. COUNTER is clocked by the same INB− signal that clocks DATA LATCH, but COUNTER's clock input does not get disabled. In operation, the detection of a valid data packet toggles TEMP_DISABLE high and temporarily disables the inputs to DATA LATCH; the inputs remain disabled until the COUNTER overflows and TEMP_DISABLE falls.

PERM_DISABLE is generated by a circuit PERM_ DISABLE, which receives as an input the output of an AND circuit 224. The output of the AND circuit goes high when 1)the output of SOP/EOP DETECT is high, indicating a valid packet, 2)SIM/TRIM0 and SIM/TRIM1 are high, and 3) PARAM_SEL output P0 is high—indicating that the PARAM_SEL0 and PARAM_SEL1 bits are both low. Per the table in FIG. 2, these fields must contain these values if DATA LATCH is to be permanently disabled. The PERM DISABLE circuit contains a fuse which is blown when the output of AND circuit 224 goes high. When its fuse is blown, PERM_DISABLE is arranged to permanently hold its output at a logic 1, causing the DATA LATCH inputs to become permanently disabled.

A pair of bit array circuits BIT ARRAY A and BIT ARRAY B serve interface circuits between the data latch circuit and respective DACs (discussed below), with each bit array circuit providing bit patterns for a respective trimmable parameter. Each bit array circuit receives an enable signal EN from PARAM SEL, with BIT ARRAY A's enable connected to P0 and BIT ARRAY B's enable connected to P1. Each bit array also receives the output of the SOP/EOP DETECT circuit, the two SIM/TRIM bits and the trim code from DATA LATCH. With these inputs, each bit array circuit is notified when its respective parameter is to be simulated or trimmed, that the data it receives is valid, and whether to simulate a trim or to permanently encode the received trim code.

When a bit array circuit is enabled and has received valid data, it produces a multi-bit output that contains the received trim code. The output of each bit array circuit is connected to a respective DAC circuit: BIT ARRAY A's output to the input of DAC A and BIT ARRAY B's output to DAC B. Each DAC also receives a respective bias current from BIAS CKT. Each DAC is designed to produce the type of trim signal required by the circuit being trimmed; in this example, DAC A and DAC B each produce POS TRIM and NEG TRIM current outputs, which are connected to the TRIM+ and TRIM− inputs of their respective amplifiers AMP A and AMP B. The invention also contemplates the generation of trim voltages, trim frequencies, or other types of trim signals that might be used to adjust a trimmable IC parameter.

The IC circuitry shown in FIGS. 5 and 6 is merely exemplary. The invention is useful for trimming a wide variety of parameters in addition to offset voltage, and many alternative implementations of the system are possible. For example, it is not essential that a separate bias circuit be utilized to generate bias currents for the DACs—many DAC designs are self-contained and thus would not require such a circuit.

Figure 7:
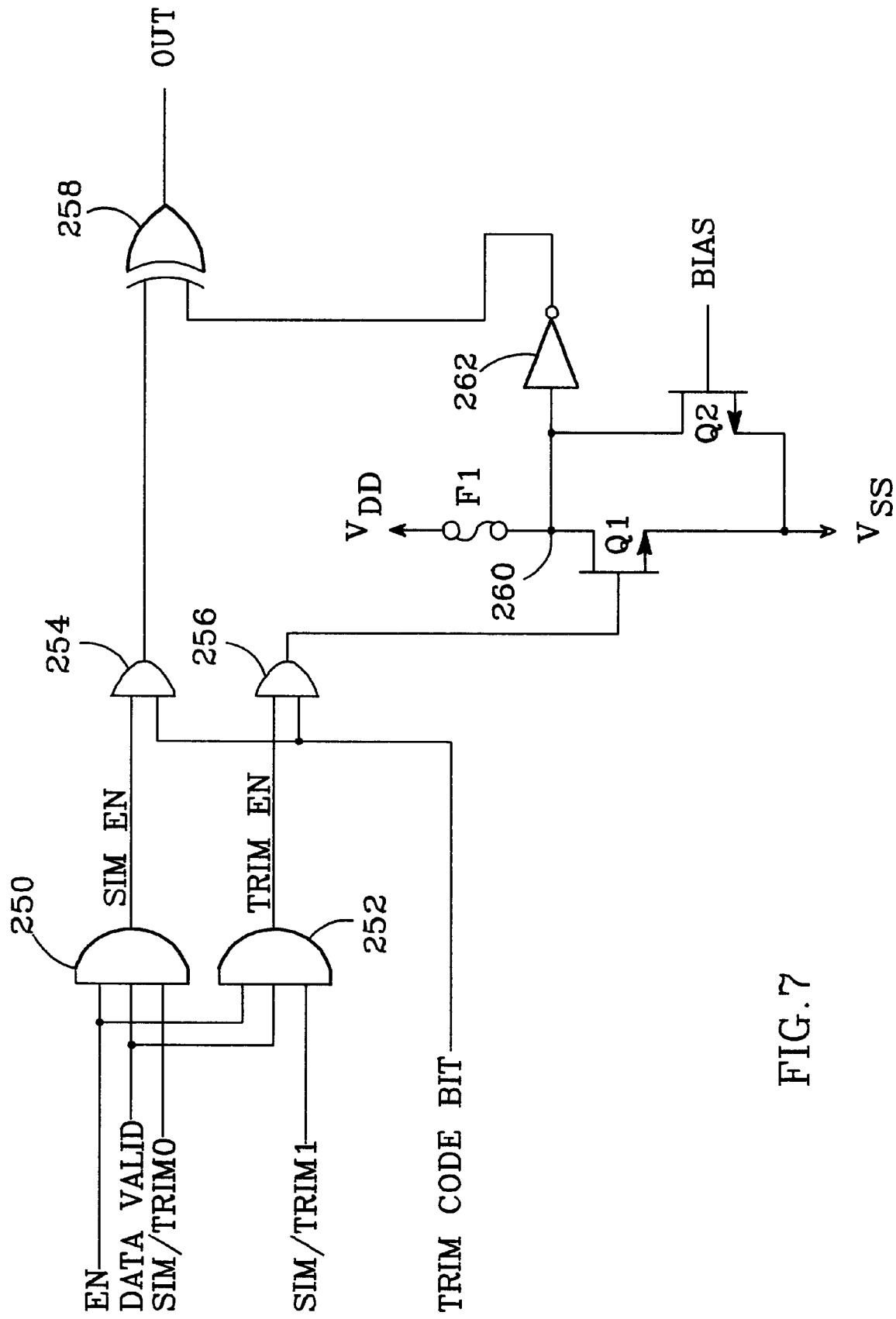
FIG. 7 is a schematic of a portion of a BIT ARRAY block shown in the diagram of FIG. 6.

A portion of an exemplary implementation of bit array circuit BIT ARRAY A is shown in FIG. 7, which shows circuitry by which a particular trim code can be simulated and then permanently encoded. An AND gate 250 receives the EN, DATA VALID, and SIM/TRIMO bits as inputs, and another AND gate 252 receives EN, DATA VALID, and SIM/TRIM1; gates 250 and 252 produce outputs SIM EN and TRIM EN, respectively. SIM EN goes high when BIT ARRAY A is enabled, a valid data packet has been received, and SIM/TRIMO is high; TRIM EN goes high under the same conditions, except that SIM/TRIM1 must be high rather than SIM/TRIMO.

SIM EN and TRIM EN are connected to respective AND gates 254 and 256, each of which also receives one bit of the multi-bit trim code received from DATA LATCH. The output of AND gate 254 is connected to one input of an exclusive-OR gate 258. The output of AND gate 256 is connected to the control input of a switching transistor Q1, preferably a FET. Q1's source is connected to $V_{SS}$, and its drain is connected to $V_{DD}$ via a poly fuse F1 at a node 260. The current circuit of another transistor Q2, preferably a FET, is connected between node 260 and $V_{SS}$, with its gate connected to a bias voltage BIAS. Node 260 is connected to an inverter 262, the output of which is connected to exclusive-OR gate 258. The output of gate 258 is one bit of the multi-bit output produced by BIT ARRAY A. The configuration of components 254, 256, 258, 260, Q1, Q2, and F1, is repeated for each bit of the trim code received from DATA LATCH; each such configuration produces one bit of the multi-bit output supplied to DAC A.

When a simulation is performed, SIM EN is high and TRIM EN is low, making the input to Q1 low and keeping Q1 off. With Q1 off, $V_{DD}$ is presented to the input to inverter 262, making inverter 262's output low. Enabled gate 254 passes the trim code bit on to exclusive-OR gate 258, which, due to the logic 0 at its other input, will pass the trim code bit's logic state onto the output OUT.

When a trim is performed, SIM EN is low and TRIM EN is high. If the trim code bit is also high, the output of gate 256 is high, which turns on Q1. When turned on, Q1 conducts a current sufficient to blow fuse F1—typically about 250 ma for a poly fuse. Q2 acts to pull-down node 260, so that a logic 0 is presented to inverter 262 and thus a logic 1 presented to gate 258. The output of gate 254 will be low due to the low SIM EN bit, and thus the logic 1 from inverter 262 makes OUT a logic 1 as well. In this way, a trim code bit equal to 1 is permanently encoded.

If the trim code bit to be permanently encoded is equal to 0, the input to Q1 is also 0, which keeps Q1 off and prevents F1 from being blown. Once the PERM_DISABLE bit is set, no new data bits are entered into DATA LATCH, insuring that the TRIM_EN and SIM_EN signals will always be low. Thus, zeroes will always be presented to both inputs of exclusive-OR gate 258, producing a permanent logic zero output.

Circuitry similar to that shown in FIG. 7 (Q1, Q2, F1 and gate 262) can be used in the PERM_DISABLE circuit. When its fuse is blown, it permanently applies a logic 1 to the INPUT_DISABLE input of DATA LATCH, permanently disabling the DATA and CK inputs.

As noted in connection with FIGS. 5 and 6, above, the circuitry of FIG. 7 is merely illustrative. Many possible circuit configurations could be utilized to select a parameter, simulate a trim adjustment for that parameter, and permanently encode the trim adjustment. For example, though a fuse F1 is used to encode a logic 1 in FIG. 7, other types of devices, such as a programmable ROM for example, could be used to fix a logic state.

The outputs of BIT ARRAY A and BIT ARRAY B are fed to the inputs of respective DACS. The DACs are implemented as needed to serve the needs of a particular parameter of interest, in any number of ways well-known to those in the art. It is only necessary that the DAC circuit accept a bit pattern as an input and produce an output that varies with the value of the bit pattern. For example, a DAC may consist of an array of binary weighted current sources and current direction switches. The received bit pattern is arranged to turn on the current sources in particular combination, and the currents are summed by the current direction switches to produce a desired trim signal.

While particular embodiments of the invention have been shown and described, numerous variations and alternate embodiments will occur to those skilled in the art. Accordingly, it is intended that the invention be limited only in terms of the appended claims.

I claim:

1. A system for trimming and simulating the effect of trimming integrated circuit (IC) parameters, comprising:
   an input circuit arranged to receive a digital bit pattern,
   a plurality of digital to analog converters (DACs), each of which produces a respective trim signal at an output in response to a digital bit pattern received at an input, said trim signals connected to affect respective parameters of electronic circuitry within an IC, said IC having a plurality of input/output (I/O) pins, and
   an interface circuit connected between said input circuit and said DACs arranged to receive a parameter select signal that selects one of said parameters to be trimmed and to apply the digital bit pattern received by said input circuit to said selected parameter's respective DAC upon receipt of a simulation bit, and to permanently apply said digital bit pattern to said DAC upon receipt of a trim bit,
   said input circuit, said DACs, and said interface circuit packaged together within said IC and operable via said IC's I/O pins, thereby enabling said parameters to be trimmed post-assembly.

2. The system of claim 1, wherein said input circuit is a data latch circuit arranged to latch said received digital bit pattern.

3. The system of claim 1, wherein said input circuit is connected to first and second ones of said I/O pins, said input circuit receiving said digital bit pattern as a serial bit stream via said first I/O pin and a clock signal via said second I/O pin, said serial bit stream clocked into said input circuit with said clock signal.

4. The system of claim 1, wherein said interface circuit includes subcircuits which include respective fuses, said subcircuits programmable to permanently apply said digital bit pattern to said selected parameter's respective DAC upon receipt of said trim bit.

5. The system of claim 1, wherein said input circuit is arranged to require the receipt of a predetermined bit sequence before said digital bit pattern received by said input circuit is applied to said selected parameter's respective DAC, said predetermined bit sequence requirement to insure the validity of said digital bit pattern received by said input circuit.

6. The system of claim 1, further comprising circuitry arranged to selectably switch an IC parameter that is otherwise not accessible via one of said I/O pins to one of said I/O pins for measurement.

7. The system of claim 1, further comprising electronic circuitry within said IC having associated parameters that vary in response to a trim signal.

8. The system of claim 7, wherein said electronic circuitry, said input circuit, said DACs, and said interface circuit are packaged together within said IC.

9. The system of claim 1, further comprising test equipment external to said IC which measures said selected IC parameter, determines whether said selected parameter is within an acceptable range, and outputs said digital bit patterns to said input circuit.

10. The system of claim 9, wherein said external test equipment is programmed to output said digital bit patterns to said input circuit iteratively until said selected IC parameter is determined to be within said acceptable range.

11. An integrated circuit (IC) which includes circuitry for trimming and simulating the effect of trimming a plurality of said IC's parameters, comprising:

an IC package including a plurality of input/output (I/O) pins which provide electrical access to circuitry housed within said package, electronic circuitry within said IC package having a plurality of associated parameters which vary in response to respective trim signals, and circuitry within said IC package for trimming and simulating the effect of trimming said parameters, said circuitry comprising:

an input circuit arranged to receive a digital bit pattern, a plurality of digital to analog converters (DACs), each of which produces a respective trim signal at an output in response to a digital bit pattern received at an input, said trim signals connected to affect respective ones of said parameters, parameter selection circuitry arranged to select one of said plurality of parameters to be trimmed, and an interface circuit connected between said input circuit and said DACs and arranged to apply a digital bit pattern received by said input circuit to said selected parameter's respective DAC upon receipt of a simulation bit, and to permanently apply said digital bit pattern to said DAC upon receipt of a trim bit, said electronic circuitry and said circuitry for trimming and simulating the effect of trimming said parameters operable via said IC's I/O pins, thereby enabling said parameters to be trimmed post-assembly.

12. The IC of claim 11, further comprising circuitry arranged to selectably switch an IC parameter that is otherwise not electrically accessible via one of said I/O pins to one of said I/O pins for measurement.

13. The IC of claim 11, wherein said input circuit is connected to first and second ones of said I/O pins, said input circuit receiving said digital bit pattern as a serial bit stream via said first I/O pin and a clock signal via said second I/O pin, said serial bit stream clocked into said input circuit with said clock signal.

14. The IC of claim 11, wherein said input circuit is a data latch circuit arranged to latch said received digital bit pattern.

15. The IC of claim 11, wherein said interface circuit includes subcircuits which include respective fuses, said subcircuits programmable to permanently apply said digital bit pattern to said selected parameter's respective DAC upon receipt of said trim bit.

16. The IC of claim 11, further comprising a permanent disable circuit arranged to, upon receipt of a permanent disable bit, prevent said input circuit from receiving data.

17. The IC of claim 11, wherein said electronic circuitry comprises an operational amplifier having an associated offset voltage parameter which varies in response to a trim signal.

18. A method of simulating and trimming one or more parameters of an integrated circuit (IC), comprising the steps of:

selecting one of a plurality of IC parameters to be trimmed, generating a trim signal which adjusts the value of said selected parameter, measuring the value of said selected parameter, determining whether said measured value is within an acceptable range, generating a different trim signal if said measured value is not within said acceptable range, repeating the steps of measuring the value of said selected parameter, determining whether said measured value is within said acceptable range, and generating a different trim signal if said measured value is not within said acceptable range until said measured value is within said acceptable range, and permanently fixing said trim signal at a value at which said measured value is within said acceptable range whenever said IC is operational.

19. The method of 18, wherein said trim signal is generated with a digital-to-analog converter (DAC).

20. The method of 19, wherein said DAC generates said trim signal in response to a bit pattern applied at an input, said method further comprising the step of providing a bit pattern to said DAC to generate said trim signal.

21. The method of claim 20, wherein said step of fixing said trim signal is accomplished by operating programmable circuits which include respective fuses such that a bit pattern that causes said measured value to be within said acceptable range is permanently applied to said DAC.

22. The method of claim 20, further comprising the step of latching said bit pattern provided to said DAC input.

23. The method of claim 22, wherein said bit pattern is latched with a data latch circuit connected to first and second IC input/output (I/O) pins, said latch circuit receiving said bit pattern as a serial bit stream via said first I/O pin and a clock signal via said second I/O pin, said clock signal clocking said serial bit stream into said latch circuit.

24. The method of claim 18, further comprising the steps of performing an initial measurement of the value of said selected parameter and calculating the trim signal needed to cause said measured value to be within said acceptable range prior to generating a trim signal which adjusts the value of said selected parameter.

25. The method of claim 18, further comprising the steps of:
- selecting another parameter to be trimmed and repeating the steps of:
    - generating a trim signal which adjusts the value of the newly selected parameter,
    - measuring the value of said newly selected parameter,
    - determining whether said measured value is within an acceptable range,
    - generating a different trim signal if said measured value is not within said acceptable range,
    - repeating the steps of measuring the value of said newly selected parameter, determining whether said measured value is within said acceptable range, and generating a different trim signal if said measured value is not within said acceptable range until said measured value is within said acceptable range, and
    - permanently fixing said trim signal at a value at which said measured value is within said acceptable range whenever said IC is operational,
- until a trim signal has been permanently fixed for each of said IC parameters to be trimmed.

26. The method of claim 18, wherein said method is performed after said IC is assembled.

27. The method of claim 18, wherein said method is performed for an IC having a plurality of input/output (I/O) pins and further comprising the step of selectably switching an IC parameter that is otherwise not electrically accessible via one of said I/O pins to one of said I/O pins for measurement.

28. A method of simulating and trimming a plurality of parameters of an integrated circuit (IC), comprising the steps of:
- selecting one of a plurality of IC parameters to be trimmed, each of said parameters varying in response to a respective trim signal,
- measuring the value of said selected parameter,
- calculating a value for said selected parameter's trim signal needed to bring said selected parameter within an acceptable range,
- generating a bit pattern that will cause said selected parameter's trim signal to be generated with said calculated value,
- verifying the validity of said generated bit pattern,
- generating said selected parameter's trim signal when the validity of said bit pattern has been verified,
- measuring the value of said selected parameter,
- determining whether said measured value is within an acceptable range,
- generating a different trim signal if said measured value is not within said acceptable range,
- repeating the steps of calculating a trim signal value, generating a bit pattern that will provide said trim signal value, verifying the validity of said bit pattern, generating said trim signal, measuring the value of said selected parameter, determining whether said measured value is within said acceptable range, and generating a different trim signal if said measured value is not within said acceptable range until said measured value is within said acceptable range,
- permanently fixing said trim signal at a value at which said measured value is within said acceptable range whenever said IC is operational, and
- repeating the process for each remaining parameter to be trimmed.

29. The method of claim 28, further comprising the step of disabling the ability to generate trim signals after trim signals have been permanently fixed for each of said parameters to be trimmed.

* * * * *